United States Patent [19]
Fitzgerald et al.

[11] Patent Number: 6,061,507
[45] Date of Patent: May 9, 2000

[54] SCHEDULING DIAGNOSTIC TESTING OF AUTOMATED EQUIPMENT FOR TESTING INTEGRATED CIRCUIT DEVICES

[75] Inventors: Glenn R. Fitzgerald, Garland; Lowell Boggs, Jr., Lewisville; Amy Dessert; Michael Allen Walsh, both of Plano; Eric Gregory Moore, Richardson; Stephanie Luhring Smith, Plano; Don L. Simpson, Pottsboro, all of Tex.

[73] Assignee: Texas Instruments Incorporated, Dallas, Tex.

[21] Appl. No.: 08/988,580

[22] Filed: Dec. 11, 1997

Related U.S. Application Data

[60] Provisional application No. 60/033,156, Dec. 13, 1996.

[51] Int. Cl.[7] .................................................. G01R 31/02
[52] U.S. Cl. ........................................................ 395/500.03
[58] Field of Search .......................... 324/158.1; 364/489

[56] References Cited

U.S. PATENT DOCUMENTS 5,589,765  12/1996  Ohmart ................................ 324/158.1

*Primary Examiner*—Kevin J. Teska
*Assistant Examiner*—Thuan Do
*Attorney, Agent, or Firm*—Robert L. Troike; Richard L. Donaldson

[57] ABSTRACT

A method of using a processor-based integrated circuit (IC) tester (12) to automatically invoke diagnostic testing. A diagnostic schedule (30) is user-defined (FIG. 3), and checked by the tester (12) at various times, such as before and after the tester 12 tests an IC lot (FIGS. 6, 7, 8). The schedule (30) has various scheduling parameters that permit diagnostic testing to be scheduled to occur at certain times, at the expiration of intervals, or upon certain events. The schedule (30) also permits different levels of diagnostic testing, each level with its own schedule. The tester (12) is programmed to run an appropriate level of diagnostic testing if more than one level is due to occur.

23 Claims, 6 Drawing Sheets

|  | Equipment Type: Impact 1 |  |  |  |  |  |
|---|---|---|---|---|---|---|
|  | Serial Number: 1 |  |  |  |  |  |
|  | Testhead Number: 1 |  |  |  |  |  |
|  | Enable/Disable: E |  |  |  |  |  |

| Diag Lvl | Time, Interval or Event | Expiration Day/ Time/ Month Day | OL | CL | Interval Hrs/Mins Days hh:mm | Event Countdown ES   EOU |
|---|---|---|---|---|---|---|
| 1_ | I |  | Y | Y | 0_  1:30_ |  |
| 2_ | I |  | Y | Y | 0_  1:30_ |  |
| 3_ | T | 1_  8:00_ | Y | N |  |  |
| 3_ | T | 15  8:00_ | Y | N |  |  |
| 4_ | T | 7_  10:00_ | Y | N |  |  |
| 4_ | I |  | Y | N | 7_  ____ |  |
| 5_ | T | 3_  8:00_ | Y | Y |  |  |
| 5_ | I |  | Y | Y | 2_  ____ |  |
| 6_ | I |  | N | Y | 1_  ____ |  |
| 7_ | I |  | Y | Y | 0_  6:00_ |  |
| 8_ | I |  | Y | Y | 0_  1:30_ |  |
| 9_ | E |  |  |  |  | 5_   ____ |
| 10 | E |  |  |  |  | ____  100 |
| 11 | I |  | Y | Y | 0_  0:00_ |  |

RTN-Accept  ?Help  +:Next  -:Back  A-dd line  D-el line  ESC-QUIT

```
Automatic Diagnostic Pin Status Report, 64-Pin Testhead
    PIN NUMBER:   1

Level      Code      Data         Time

1        PASS      05/20/94     11:23
      2        PASS      05/20/94     20:57
      3        PASS      05/19/94     10:36
      4        PASS      05/18/94     03:15
      .          .          .           .
      .          .          .           .
      .          .          .           .
    (max level)
```

FIG. 9

```
64-Pin Testhead           Start Time:   05/15/94  00:00
                          End Time:     05/20/94  23:00
PIN NUMBER:   1

Level      Code      Data         Time

2        PASS      05/20/94     11:23
  1         9        05/20/94     20:57
  1         9        05/19/94     10:36
  4        PASS      05/18/94     03:15
  .          .          .           .
  .          .          .           .
  .          .          .           .
```

FIG. 10

SCHEDULING DIAGNOSTIC TESTING OF AUTOMATED EQUIPMENT FOR TESTING INTEGRATED CIRCUIT DEVICES

This application claims priority under 35 USC §119(e)(1) of Provisional Application No. 60/033,156 filed Dec. 13, 1996.

TECHNICAL FIELD OF THE INVENTION

The present invention relates generally to automated testing of integrated circuits, and more particularly to a method of scheduling diagnostic testing of automated test equipment used to test integrated circuit devices.

BACKGROUND OF THE INVENTION

Today's semiconductor manufacturers rely on automated test equipment for testing semiconductor devices prior to shipment to customers. These testers are sophisticated processor-based systems, programmable to perform numerous types of electronic device tests.

The testing of integrated circuits may occur at various stages during the manufacturing process, provided that the units being tested are at a stage of manufacture where they are capable of some form of electronic testing and of electrical connection to pins of the test equipment. The testing may be "front-end" testing, such as of slices of wafers from which die for semiconductor devices will be cut. Or, the testing may be "back-end" testing of completed or nearly completed devices. In either case, the group of units being tested, that is, a group of slices or devices, is referred to as a "lot". "Final-testing" is a back-end test that ensures that the completed devices meet quality specifications before shipment to customers. Depending on when the testing occurs, the testing may be of AC, DC, parametric, or dynamic electrical characteristics.

A problem with semiconductor test equipment is that it can drift out of specification during testing. For this reason, users of such equipment perform test verification to ensure that test equipment is operating properly.

One approach to verification is to first test a number of lots. Samples are then randomly taken from these lots and retested. The theory is that if the retest confirms that the samples are good, then the first test must have been correct. Another approach to verification is based on the assumption that a test of a particular lot of integrated circuits is correct if it is known that the test equipment was operating properly before and after the lot was tested. This approach is described in U.S. patent application Ser. No. 08/368,683, entitled "Method for Final Testing of Semiconductor Devices", assigned to Texas Instruments Incorporated.

The test equipment may be programmed to perform self-testing to verify equipment performance, a process referred to as "diagnostic testing". The diagnostic test can be defined and supplied by the vendor of the test equipment or it can be defined by the user of the equipment.

SUMMARY OF THE INVENTION

One aspect of the invention is a method of using a processor-based integrated circuit tester to control diagnostic testing. The tester performs device testing on a number of integrated circuits as a lot, and accesses a diagnostic schedule before device testing the lot. The schedule indicates when diagnostic testing is to be performed, whether the schedule is to be checked at the opening of the lot, and whether the schedule is to be checked at the close of the lot. The scheduling parameters can call for diagnostic testing at specified times, at the expiration of specified intervals, or upon the occurrence of specified events. The tester checks the schedule before, during, or after device testing, or at some combination of these times. The tester thereby determines whether the schedule indicates that diagnostic testing is to be performed. When the schedule so indicates, the tester performs the diagnostic testing. The diagnostic test must be passed before device testing can continue.

Different levels of diagnostic tests may be defined, each with a different schedule. If two different levels of testing are scheduled, the tester selects an appropriate level.

An advantage of the invention is that diagnostic testing is performed automatically, but according to a user-defined schedule that permits scheduling according to a number of different scheduling parameters. During the actual device testing, operator input is minimized.

BRIEF DESCRIPTION OF THE DRAWINGS

FIGS. 9 and 10 illustrate examples of diagnostic status reports.

DETAILED DESCRIPTION OF THE INVENTION

Figure 1:
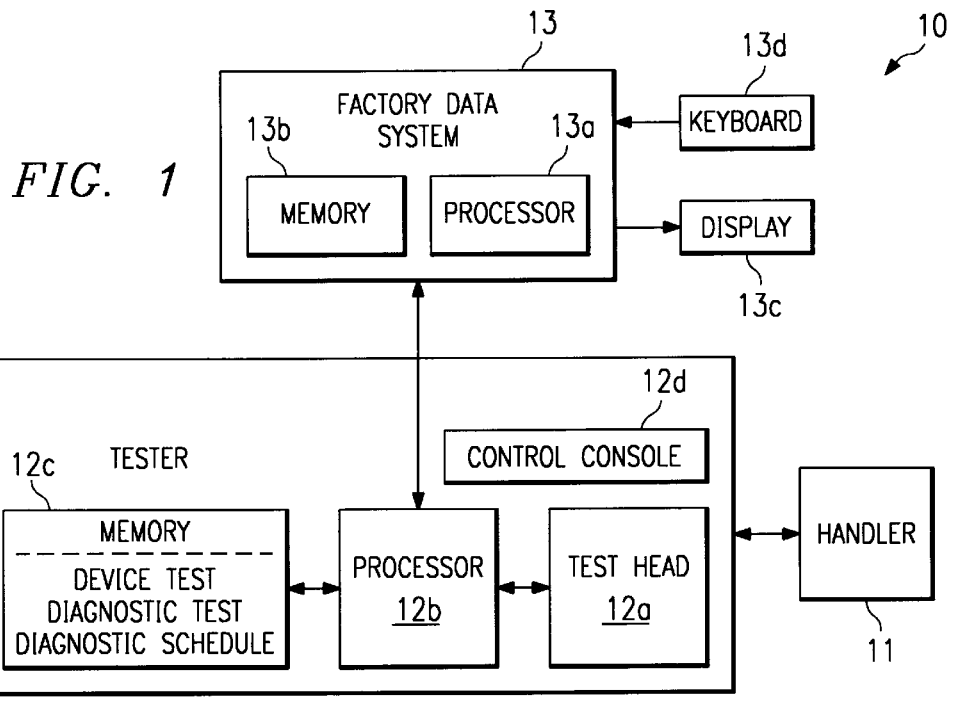
FIG. 1 illustrates a test system for testing integrated circuit devices and performing diagnostic testing in accordance with the invention, that is, for performing "autodiagnostic device testing".

FIG. 1 illustrates a test system 10 for testing integrated circuits (ICs), as well as for performing diagnostic testing in accordance with the invention. As explained in the Background, the testing of the devices may be front-end or back-end, and the units being tested can be slices, die, or packaged devices. The testing of the devices is referred to herein as "device testing" to distinguish it from "diagnostic testing".

Examples of ICs that may be tested with system 10 are memory devices, logic devices, and micro-electrical mechanical devices. In general, for purposes of this description, an IC could be any device that is made by semiconductor fabrication techniques and that may be electronically tested with a testhead having one or more "pins" for making electrical connections to the device under test.

The invention described herein is directed to a method of scheduling diagnostic testing and performing the diagnostic testing according to the schedule. As explained below, test system 10 follows a diagnostic schedule. The schedule is defined in accordance with the invention and checked at predetermined times, such as before, during, or after device testing, so that diagnostic testing may occur at any of these times. The schedule permits different levels of diagnostic testing, with each level having its own schedule. The process of performing device testing and diagnostic in accordance with the invention is referred to herein as "autodiagnostic device testing".

A handler 11 performs mechanical handling of the ICs during device testing. Handler 11 can have various levels of sophistication. Depending on its sophistication, it can perform tasks such as electrical connection and disconnection to the testhead 12a of tester 12 and sorting good and bad ICs after they are tested. Handler 11 is disabled during diagnostic testing.

Tester 12 has a testhead 12a containing testing circuitry and has pins for electrical connection to one or more units (slices, dies, or devices) during device testing. Typically, testhead 12a is used with per-pin connections, where one pin of testhead 12a drives one pin of the unit under test. Testhead 12a can be connected to a single unit, or it can be connected to more than one unit for testing in series or in parallel. Testhead 12a typically has some sort of test controller for controlling electrical signals to the pins.

Tester 12 has a processor 12b for executing test programming and memory 12c for storing the test programming. The test programming includes both device tests and diagnostic tests. Thus, as well as performing device testing, tester 12 performs diagnostic testing.

A control console 12d controls overall operations. It provides for interaction with an operator and has an input device, such as a keyboard, and an output device, such as a CRT display.

An example of tester 12 is the Impact1 logic device tester, manufactured by Texas Instruments Incorporated. The Impact1 may have multiple testheads 12a, each with its own processor 12a. The testheads may run independently, such as by concurrently performing different tests on different types of ICs. The Impact1 is further described in U.S. patent application Ser. No. 08/697,662, entitled "Integrated Circuit Testing System and Method", assigned to Texas Instruments Incorporated and incorporated herein by reference.

In the embodiment of FIG. 1, device tests, diagnostic tests, and the diagnostic schedule are set up on a factory data system 13, which is in data communication with tester 12. As explained below, the tests and the schedule are downloaded to tester 12. The use of system 13 permits centralized configuration and scheduling of tests for numerous testers 12 and for all types of ICs to be tested. The use of system 13 also reduces the amount of memory 12c required for tester 12, in that device and diagnostic test programs may be downloaded to tester 12 and disposed of (cleared from memory 12c of tester 12) after they are executed.

Factory data system 13 also provides for collection, storage, reporting, extraction, and archiving of diagnostic data, that is, data collected during diagnostic testing. The same system 13 may also perform these tasks for the device tests. System 13 is used to define the devices that will comprise each lot to be tested. System 13 has a display 13c and keyboard 13d, which permit the user to interact with system 13.

As an alternative to the embodiment of FIG. 1, the diagnostic test schedule could be built directly on tester 12 and stored in its memory 12c. This would be the case for "stand-alone" type testers 12, which are not part of a test data network. This type of tester 12 could also store its own device tests and diagnostic tests, and lot definitions could be entered directly to it.

Regardless of whether the tests and the diagnostic schedule are downloaded to tester 12 or originate in it, tester 12 accesses a diagnostic schedule. The schedule informs tester 12 when to access and execute diagnostic tests.

A user interface permits a user to define the diagnostic schedule. In the embodiment of FIG. 1, this interface resides on factory data system 13. A schedule for a testhead 12a is enabled and defined before diagnostic can be activated for that testhead 12a. If tester 12 has more than one testhead 12a, a separate schedule is defined for each testhead 12a of tester 12.

Figure 2:
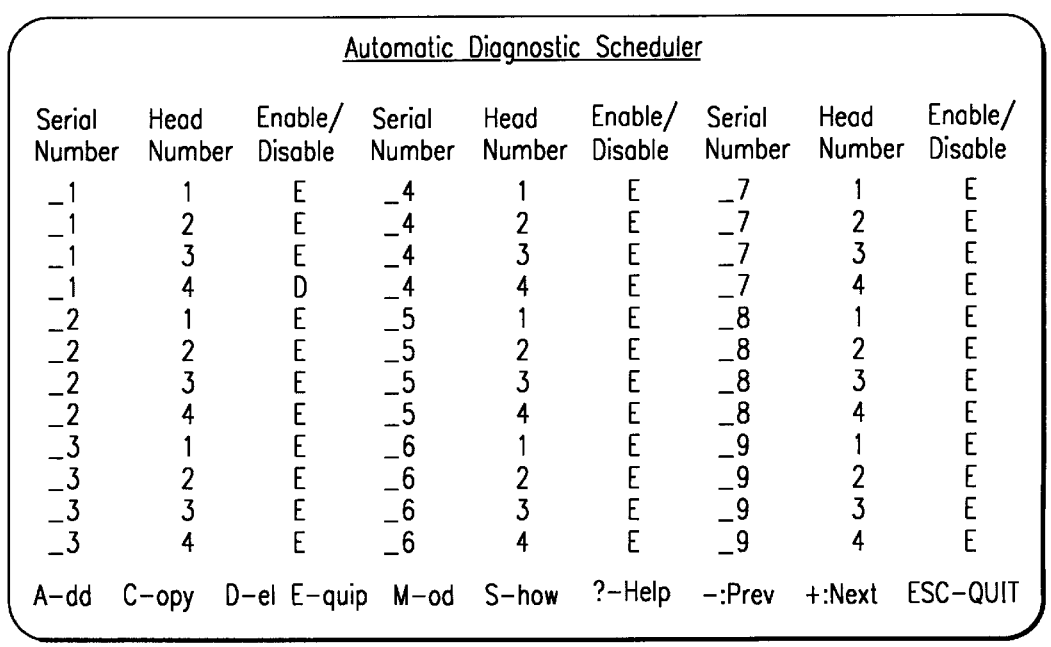
FIG. 2 illustrates a user interface display for enabling a diagnostic schedule.

FIG. 2 illustrates a user interface display 20 for enabling a diagnostic schedule. In the example of FIG. 2, the display 20 prompts the user to enter enable/disable flags for 9 different testers 12, each identified by its serial number. Each tester has 4 testheads, which may be enabled or disabled for diagnostic testing. For a simpler test system, such as system 10 having a single tester 12 and a single testhead 12a, the display 20 would need only prompt for an enable flag for that testhead 12a.

Figures 3, 4:
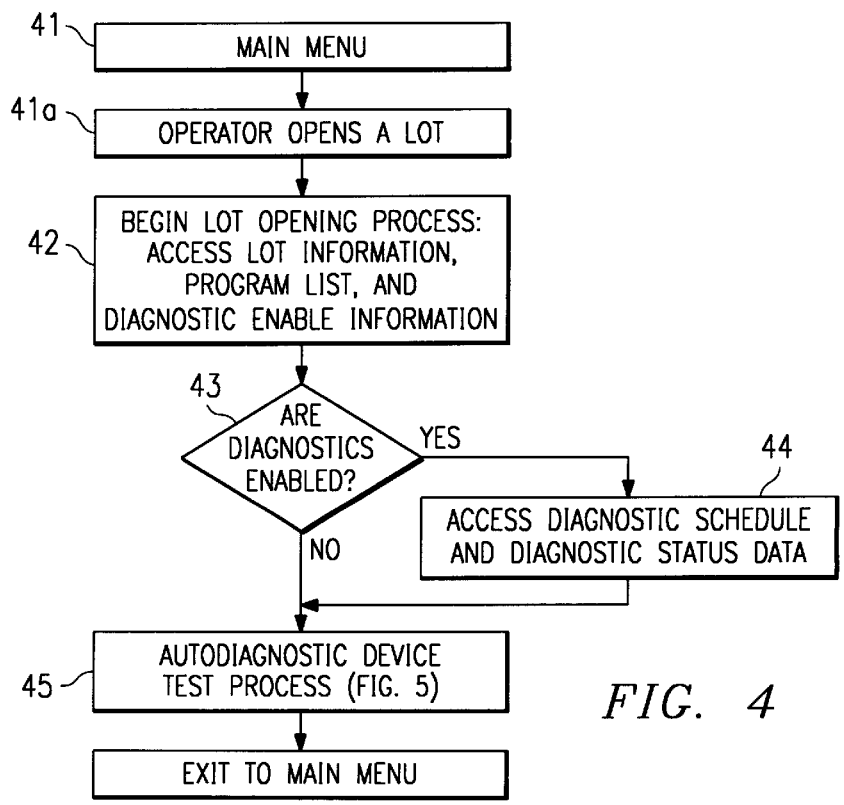
FIG. 3 illustrates a user interface display for defining a diagnostic schedule.
FIG. 4 illustrates the basic steps of autodiagnostic device testing in accordance with the invention.

FIG. 3 illustrates an example of a user interface display 30 that permits the user to define a diagnostic schedule for a particular testhead 12a. Like the diagnostic enable display 20, display 30 is generated by factory data system 13 and system 13 receives the user input.

As illustrated in FIG. 3, diagnostic schedules can be defined by levels. The smaller the level, the more extensive the diagnostic test. For example, levels might be available as follows:

| level | description |
|---|---|
| 1 | AC/DC automatic calibration |
| 2–99 | optional levels |
| 100–n | special case diagnostic |

A Diagnostic Level field permits the user to enter the level number.

Diagnostic testing at each level may be independently scheduled. Specifically, for each level, an Expiration Flag field permits a schedule to be defined based on a "T", "I", or "E" flag. These flags indicate whether diagnostic testing is to be performed at an expiration time, interval, or event. If the user enters "T", two expiration time fields permit entry of an expiration time. The "Day of Month" field permits entry of the day of the month when the diagnostic testing is to occur. The Time of Day permits entry of the time when the diagnostic testing is to occur. If the user enters "I", two expiration interval fields permit entry of an expiration interval. The Days field permits entry of the number of days after which the diagnostic testing will occur. The Hours/Minutes field permits entry of the amount of hours/minutes after which the diagnostic testing will occur. If the user enters "E", two expiration event fields permit the user to specify "ES" (end of segment) or "EOU" (end of unit) countdown. The ES field permits entry of the number of segments (slices of a wafer) after which the diagnostic testing will occur. The EOU field permits entry of the number of devices tested after which the diagnostic testing will occur.

The OL and CL fields indicate whether tester 12 will check the schedule at Open Lot or Close Lot time, respectively.

Diagnostic testing may be invoked manually, or it may be invoked automatically according to the above-described schedule. For manual invocation, tester 12 provides menus at various stages. For automatic invocation, once a lot is opened, tester 12 performs various schedule checks.

When manually invoking a diagnostic test, the operator may choose the diagnostic test level. When diagnostic testing is automatically invoked, tester 12 checks all levels to determine which are due to be executed. If a time, interval, or event has expired for a particular level, it is time to run diagnostic testing for that level.

Although diagnostic testing is scheduled by level for an entire testhead 12a, during automatically invoked diagnostic testing, tester 12 performs diagnostic testing on a pin-by-pin basis. The diagnostic testing is performed only on the pins in use by testhead 12a for a particular lot. For each pin of testhead 12a that is being used, tester 12 builds a levels list. From this list, it determines all the diagnostic tests that are due to be run. The levels may be specified so that each level contains the tests of those levels with a higher level number. Then, only the lowest numbered level is performed. Tester 12 may be further programmed so that the lowest diagnostic level for any of the pins used will be performed for all the pins used.

When a lot is to be tested and automatic diagnostic testing is enabled, tester 12 accesses diagnostic status data as well as the schedule. Like the schedule, the status data may indicate that diagnostic test programs need to be accessed and executed. For example, tester 12 may be programmed to require that diagnostic testing is passed for all pins used to test a lot before that lot can be tested.

Regardless of whether diagnostic testing is invoked manually or automatically, after invocation, a display on console 12d informs the operator that diagnostic testing is running. Also, handler 11 is disabled, either automatically or manually by the operator in response to a prompt. Then, the appropriate diagnostic test programs are accessed, a step which may be preceded by downloading them from system 13. After the diagnostic testing is performed, the results are displayed and may be offloaded to system 13. The diagnostic test programming is disposed. If the test is passed, the operator is prompted to re-enable the handler. If the test is not passed for any pin, the diagnostic test for that pin may be re-executed one or more times with tightened limits to ensure that marginal failures become constant failures. If the retest(s) are failed, the tester 12 may close the lot or it may inform the operator to take appropriate action.

FIGS. 4–9 illustrate a method of performing autodiagnostic device testing, with the diagnostic testing being scheduled in accordance with the invention. The FIGURES illustrate successively more detailed steps of the method, with some FIGURES being detail of a step of a previous FIGURE. The method is performed by tester 12, which as explained above, may receive downloaded tests and a diagnostic schedule or may be a stand-alone system. In either case, whether programming and data is downloaded or is resident, the programming and data are "accessed" in memory 12c. The programming is executed by processor 12b.

FIG. 4 illustrates the basic steps of autodiagnostic device testing. In Step 41, a main menu permits the operator to open a diagnostic menu and to invoke a diagnostic test manually.

The main menu also permits the operator to open a lot to be tested. In Step 41a, the operator opens the lot by identifying it. In Step 42, system 13 downloads lot information, a program list for the device tests, and diagnostic enable information. The program list identifies which device tests are to be used for the lot—the programs are downloaded in subsequent steps on request by tester 12. In Step 43, tester 12 determines whether diagnostic testing is enabled for that lot. If so, in Step 44, a diagnostic schedule for testhead 12a is downloaded from system 13. Diagnostic status data may also be downloaded. Regardless of whether diagnostic testing is enabled, in Step 45, the device test programs are accessed and executed.

Figure 5:
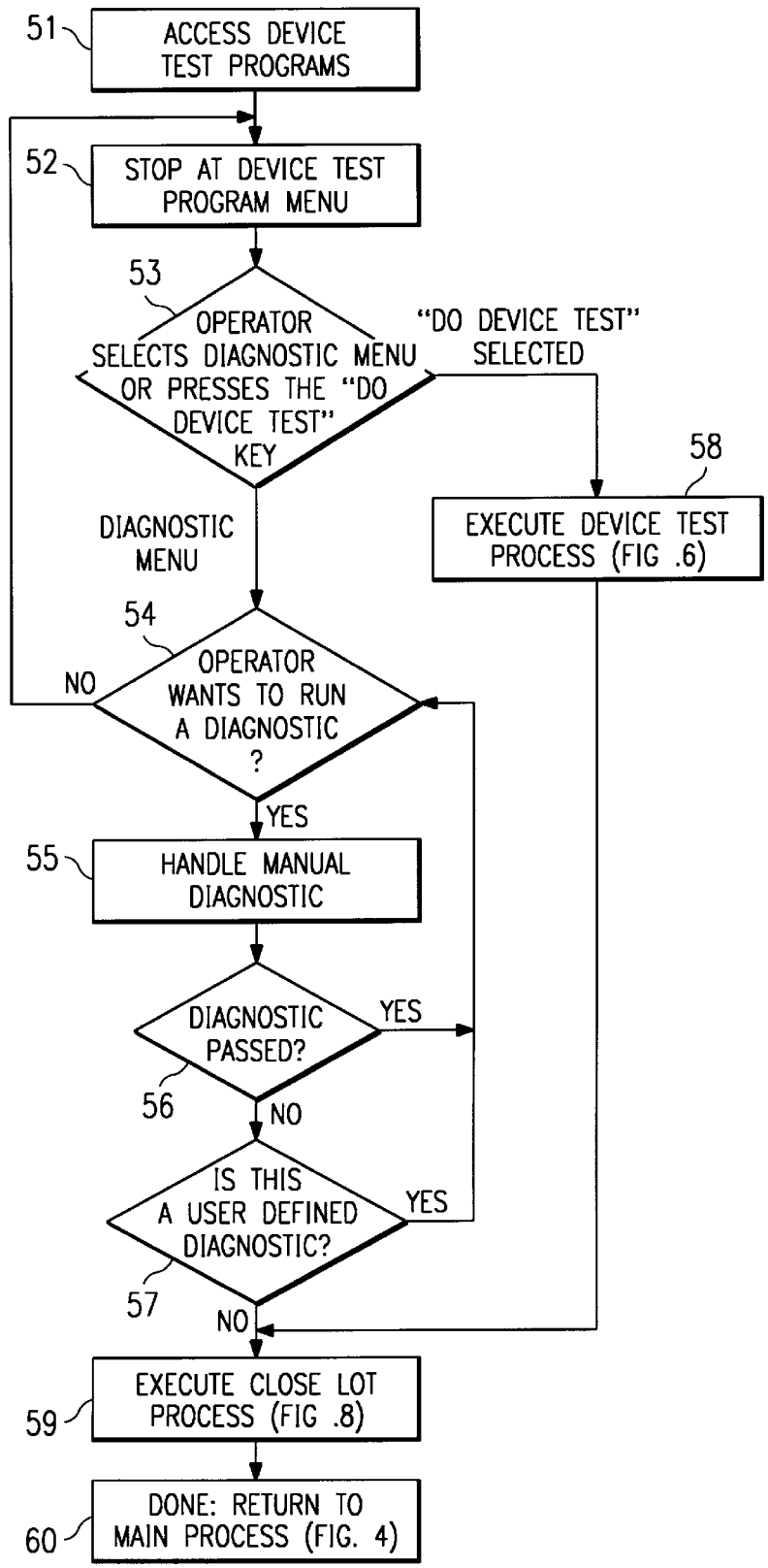
FIG. 5 illustrates the autodiagnostic device test process of FIG. 4.

FIG. 5 illustrates the autodiagnostic device test process, which is Step 45 of the main process of FIG. 4. In Step 51, the device test programs are accessed. In Step 52, a device test menu is displayed. Like the main menu of FIG. 4, this menu permits the operator to manually invoke diagnostic testing. Thus, in Step 53, the operator can either select a diagnostic menu or press a "Do Test" key. If the operator selects the diagnostic menu, in Step 54, the operator may manually select a diagnostic test level. In Step 55, this selected diagnostic test process is performed. In Step 56, the tester 12 determines whether the diagnostic was passed. If so, the process returns to Step 54. If not, in Step 57, tester 12 determines whether the diagnostic was user-defined. If so, the process returns to Step 54. If not, a close lot process is entered.

If the operator does not desire to invoke diagnostic testing manually, the operator may select the "Do Device Test" key in Step 53. In Step 58, a device test process is begun, during which pre-test or intra-test diagnostic testing may be automatically invoked.

Figure 6:
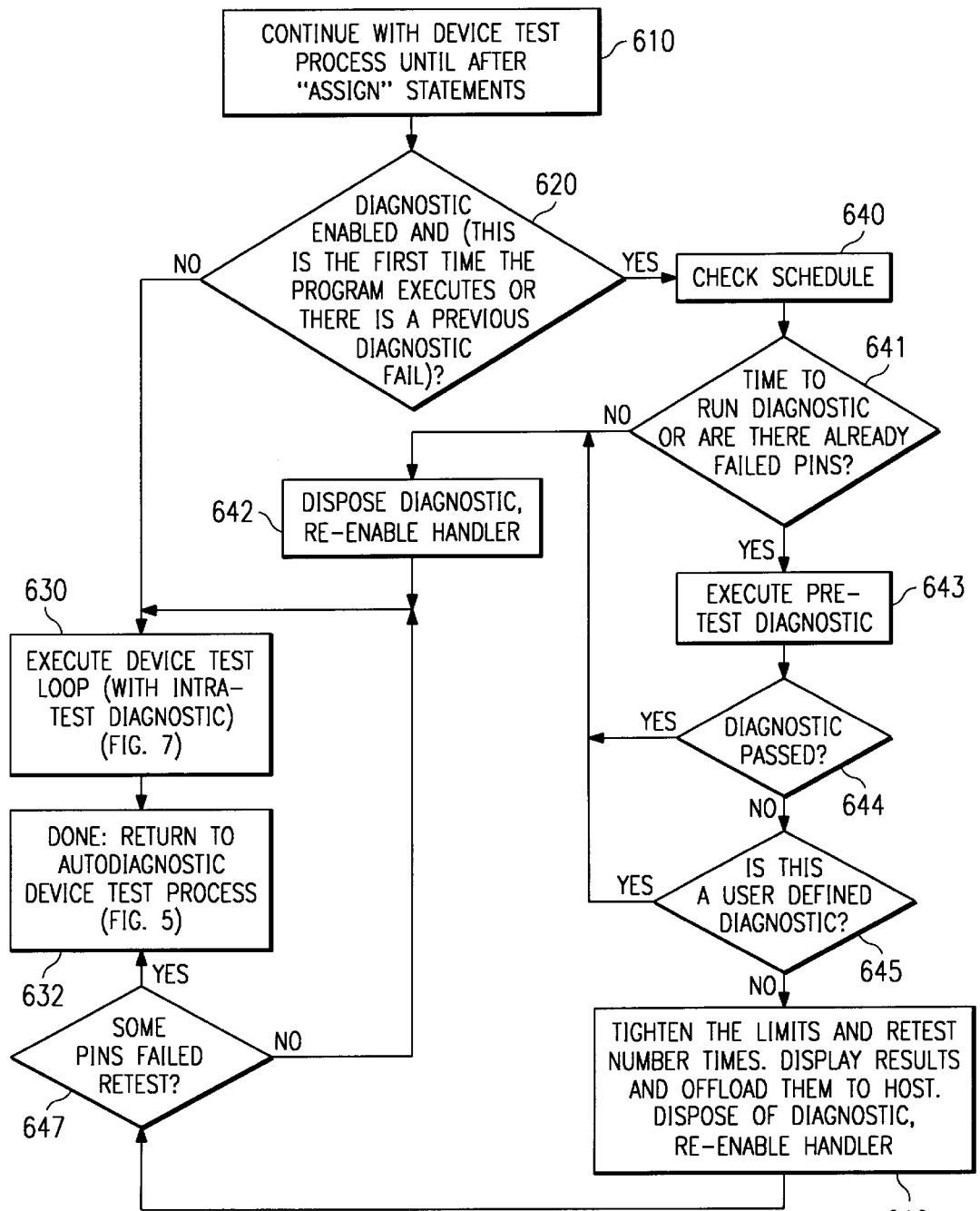
FIG. 6 illustrates the device test process of FIG. 5.

FIG. 6 illustrates the device test loop. In Step 610, an Assign statement specifies the pin connections used by testhead 12a for the unit under test. When tester 12 runs diagnostic testing on a per-pin basis, this permits tester 12 to access and execute diagnostic testing for only those pins that are being used. In Step 620, the tester 12 determines two criteria: whether diagnostic testing is enabled, and whether this is the first time the device testing for that lot has executed or there has been a previous diagnostic failure. If both criteria are met, in Step 640, the diagnostic schedule is checked.

In Step 641, the tester determines whether it is time to run diagnostic testing or if there are already failed pins on the testhead 12a. If either of these criteria are met, in Step 643, diagnostic testing is performed. Because the diagnostic testing has been automatically invoked and occurs before device testing, the diagnostic testing of Step 643 is referred to herein as a "pre-test autodiagnostic". After the pre-test autodiagnostic is run, in Step 644, the tester determines if the diagnostic was passed. If so, the process branches to Step 642, during which diagnostic test programs are disposed of and handler 11 is re-enabled. If the diagnostic was not passed, the tester 12 determines whether it was user-defined. If so, the process branches to Step 642. If not, in Step 646, the test results are displayed and offloaded to system 13. The pins may be re-tested. If they are re-tested and pass, in Step 647, the process returns to the device test loop. Otherwise, the process returns to the process of FIG. 5.

Figure 7:
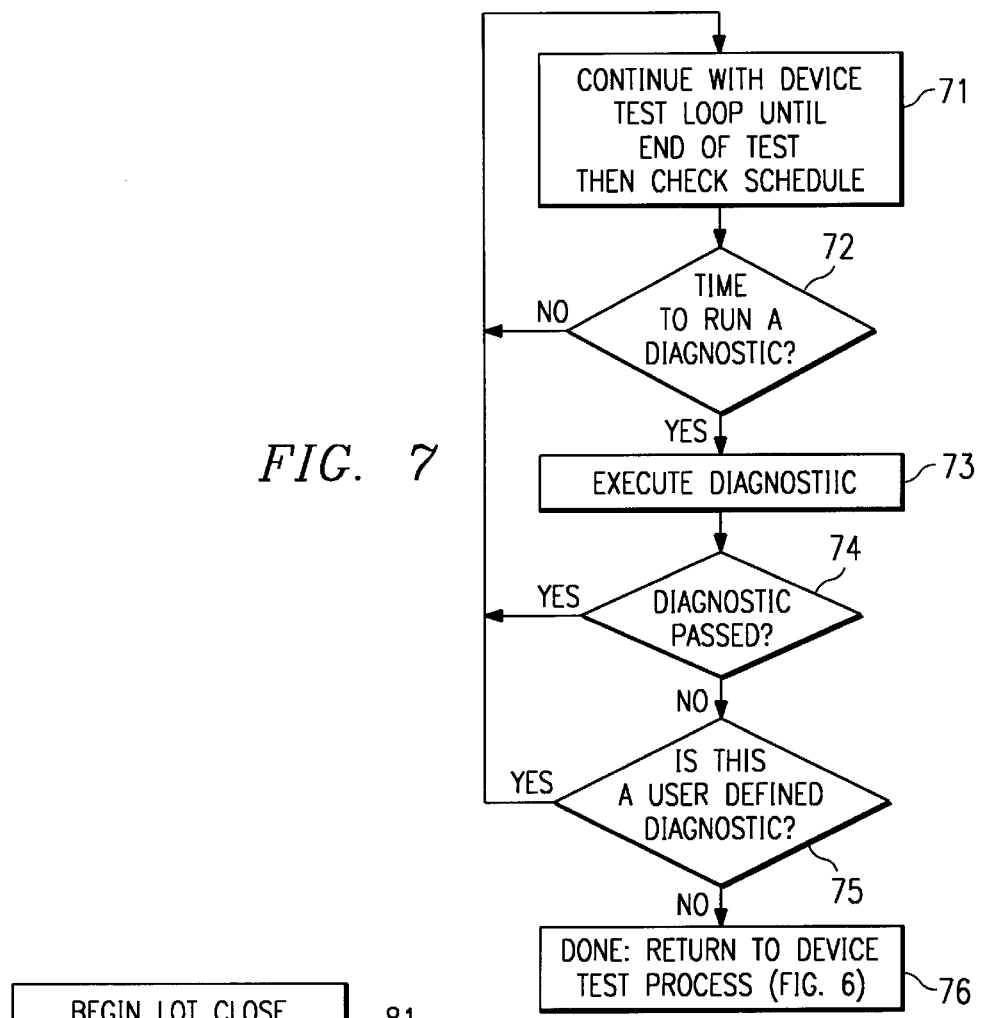
FIG. 7 illustrates the device test loop of FIG. 6.

Step 630 is the device test loop, during which the actual device testing occurs. As illustrated in FIG. 6, the device test loop may begin from a number of paths. It may occur with or without pre-test autodiagnostic having been performed. FIG. 7 illustrates the device test loop process of FIG. 6. As indicated by Step 71, the tester continues the test loop until an end-of-test signal, which occurs after each unit is tested. At this time, it checks the diagnostic schedule. In Step 72, the tester determines whether it is time to run a diagnostic test. If not, it continues the test loop. If so, in Step 73, it loads and executes the diagnostic per the schedule. This automatically invoked diagnostic test is referred to herein as an "intra-test autodiagnostic". In Step 74, tester 12 determines whether the diagnostic was passed. If so, tester continues the device test loop. If not, in Step 75, the tester determines whether the diagnostic was user-defined. If so, it continues the test loop. If not, processing control returns to the autodiagnostic device test process of FIG. 6.

Referring again to FIG. 6, after the device test loop is performed in Step 630, in Step 632, processing control returns to the autodiagnostic device test process of FIG. 5. The next step, Step 59, is a close lot process.

Figure 8:
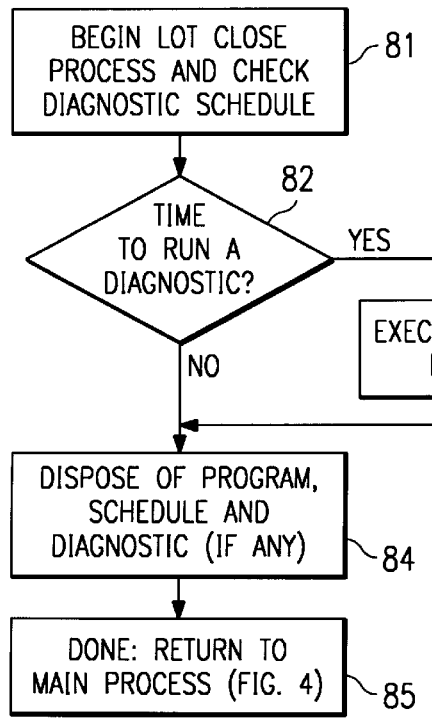
FIG. 8 illustrates the close lot process of FIG. 5.

FIG. 8 illustrates the close lot process of Step 55. In Step 81, tester 12 accesses the diagnostic schedule. In Step 82, tester 12 determines from the schedule whether it is time to run a diagnostic test. If so, in Step 83, the diagnostic test is performed. This is referred to herein as "post-test autodiagnostic". If not, in Step 84, the tester disposes the test program, the diagnostic schedule, and any diagnostic test programs. In Step 85, processing control is returned to the autodiagnostic device test process of FIG. 5.

Referring again to FIG. 5, after the close lot process is performed, in Step 60, processing control is returned the main process of FIG. 4.

The above-described process may also provide for the display of diagnostic reports. FIG. 9 illustrates a pin status report of the status of each pin of testhead 12a. The report includes the level tested, the pass/fail code, and the date and time the test was performed. A number in the pass/fail code indicates the nature of a failure. FIG. 10 illustrates a pin history report, where the test history for any pin during a specified period of time is displayed.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of using a processor-based integrated circuit tester to perform program scheduled diagnostic self testing by said tester, where said tester performs device testing on a number of integrated circuits as a lot, comprising the steps of:
    providing a programmable diagnostic scheduler for programmably setting a programmed diagnostic schedule of diagnostic self tests including at opening and closing of said lot;
    said scheduler scheduling different levels of diagnostic testing and when diagnostic testing is to be performed at the different levels;
    accessing said programmed diagnostic schedule before said device testing, said schedule indicating when said diagnostic self testing is to be performed, whether said schedule is to be checked at the opening of said lot, and whether said schedule is to be checked at the close of said lot;
    before and after said device testing, checking said programmed diagnostic schedule to determine whether said programmed diagnostic schedule indicates that diagnostic testing is to be performed; and
    automatically performing said diagnostic self testing in accordance with said programmed diagnostic schedule.

2. A system for testing integrated circuit devices, comprising:
    a testhead comprising at test controller and a plurality of pin cards, at least some of said pin cards operable to electrically connect said devices to said system;
    a programmable diagnostic scheduler for providing a programmed diagnostic schedule of diagnostic self tests; said programmable diagnostic scheduler defining different levels of diagnostic testing and when diagnostic testing is to be performed at each level including at opening and closing of a lot;
    a processor coupled to said test controller and said pin cards, said processor operable to execute device testing and diagnostic testing such that said diagnostic testing occurs automatically in accordance with said programmed diagnostic schedule generated by said programmable diagnostic scheduler scheduling diagnostic self tests accessed by said processor; and
    memory operable to store programs for said device testing and said diagnostic testing and to store said diagnostic schedule.

3. The system of claim 2, wherein said programmed diagnostic schedule generated by said programmable diagnostic scheduler indicates when said diagnostic testing is to be performed, whether said schedule is to be checked at the opening of a lot, and whether said schedule is to be checked at the close of a lot.

4. A system for testing integrated circuit devices comprising:
    a programmable diagnostic scheduler for programmably defining a self test diagnostic schedule for diagnostic self tests, said programmable diagnostic scheduler defining different levels of diagnostic testing and when diagnostic testing is to be performed for each level including at opening and closing of a lot; and
    a tester coupled to said self test diagnostic schedule operable to execute device testing and diagnostic self test of the tester such that said diagnostic testing automatically occurs in accordance with programmed self test diagnostic schedule accessed by said tester.

5. The system of claim 4, wherein said programmed diagnostic schedule generated by said programmable diagnostic scheduler indicates whether said diagnostic testing is enabled.

6. The system of claim 4, wherein said programmed diagnostic schedule generated by said programmable diagnostic scheduler indicates when said diagnostic testing is to be performed by indicating an expiration time.

7. The system of claim 4, wherein said programmed diagnostic schedule generated by said programmable diagnostic scheduler indicates when said diagnostic testing is to be performed by indicating an expiration interval.

8. The system of claim 4, wherein said programmed diagnostic schedule generated by said programmable diagnostic scheduler indicates when said diagnostic testing is to be performed by indicating an expiration event.

9. The system of claim 8, wherein said expiration event is the end of device testing of a segment of said lot.

10. The system of claim 8, wherein said expiration event is the end of device testing of a unit under test.

11. The system of claim 4, wherein said programmed diagnostic scheduler schedules automatic calibration.

12. The system of claim 4, wherein said programmed diagnostic scheduler schedules automatic calibration prior to diagnostic self test verification.

13. The system of claim 4, wherein said programmed diagnostic scheduler for each level determine whether diagnostic testing is to be performed at an expiration time, interval or event.

14. The system of claim 4, including a testhead comprising a test controller and a plurality of pin cards, at least some of said pin cards operable to electronically connect said devices to said system, and
    memory operable to store programs for said device testing and said diagnostic testing and to store said diagnostic schedule.

15. A method of receiving a processor-based integrated circuit tester to perform program scheduled diagnostic self test by said tester, where said tester performs device testing on a number of integrated circuits comprising the steps of:

providing a programmable diagnostic scheduler for programmably scheduling a self test diagnostic schedule setting different levels of diagnostic testing and said schedule setting when diagnostic testing is to be performed for each level including at opening and closing of a lot, checking said diagnostic schedule to determine when and how diagnostic testing is to be performed, and performing said diagnostic testing in accordance with said diagnostic schedule.

16. The method of claim 15, wherein said scheduler further schedules whether said diagnostic testing is enabled, and wherein said checking and performing steps are performed only if diagnostic testing is enabled.

17. The method of claim 15, wherein said scheduler schedules when said diagnostic testing is to be performed by indicating an expiration time.

18. The method of claim 15, wherein said scheduler schedules when said diagnostic testing is to be performed by indicating an expiration interval.

19. The method of claim 15, wherein said scheduler schedules when said diagnostic testing is to be performed by indicating an expiration event.

20. The method of claim 19, wherein said expiration event is the end of device testing of a segment of a lot.

21. The method of claim 19, wherein said expiration event is the end of device testing of a unit under test.

22. The method of claim 15, wherein said checking step is further performed during said device testing.

23. The method of claim 15, further comprising the step of receiving instructions for manual invocation of diagnostic testing and of performing said diagnostic testing in accordance with said instructions.

* * * * *